(12) United States Patent
Chou et al.

(10) Patent No.: US 8,193,006 B2
(45) Date of Patent: Jun. 5, 2012

(54) METHOD OF CHIP REPAIR BY STACKING A PLURALITY OF BAD DIES

(75) Inventors: Yung-Fa Chou, Kaohsiung (TW); Ding-Ming Kwai, Hsinchu County (TW)

(73) Assignee: Industrial Technology Research Institute, Hsinchu (TW)

( * ) Notice: Subject to any disclaimer, the term of this patent is extended or adjusted under 35 U.S.C. 154(b) by 209 days.

(21) Appl. No.: 12/536,499

(22) Filed: Aug. 6, 2009

(65) Prior Publication Data

US 2010/0295189 A1 Nov. 25, 2010

(30) Foreign Application Priority Data

May 25, 2009 (TW) ................................ 98117346 A

(51) Int. Cl.
*H01L 21/00* (2006.01)

(52) U.S. Cl. ....... 438/12; 438/4; 257/777; 257/E21.522; 257/E21.524; 257/E21.525; 257/E21.526

(58) Field of Classification Search ................ 438/4, 12; 257/777, E23.169, E21.521, E21.522, E21.524, 257/E21.525, E21.526
See application file for complete search history.

(56) References Cited

U.S. PATENT DOCUMENTS

| 5,946,545 A | 8/1999 | Bertin et al. | |
|---|---|---|---|
| 2009/0283916 A1* | 11/2009 | Wu | 257/777 |

* cited by examiner

*Primary Examiner* — Bradley K Smith
*Assistant Examiner* — Maria Ligai
(74) *Attorney, Agent, or Firm* — Jianq Chyun IP Office

(57) ABSTRACT

A method for repairing a chip with a stacked structure of chips is provided. First, a first chip is provided, which includes a first circuit block with a first function, a second circuit block with a second function, and a signal path electrically connected to the first and the second circuit blocks. A second chip is provided, which includes a third circuit block with the first function. The functions of the first and the second chips are verified. The first circuit block is disabled if the first circuit block is defective. The third circuit block is electrically connected to the signal path to replace the first circuit block and provide the first function if the second circuit block is functional and the third circuit block is functional.

9 Claims, 14 Drawing Sheets

METHOD OF CHIP REPAIR BY STACKING A PLURALITY OF BAD DIES

CROSS-REFERENCE TO RELATED APPLICATION

This application claims the priority benefit of Taiwan application serial no. 98117346, filed on May 25, 2009. The entirety of the above-mentioned patent application is hereby incorporated by reference herein and made a part of specification.

BACKGROUND OF THE INVENTION

1. Technical Field

The present invention generally relates to circuit repairing, in particular, to a method for repairing a chip and a stacked structure of chips.

2. Background

In the past, a spare has to be used for repairing a system on chip (SoC), and the spare refers to replicating a backup circuit block with the same function on the same chip. When it is acquired that a function of an original circuit block is failed from an inspection result of the SoC, the backup circuit block is started and replaces the original circuit block. Thus, besides that a memory is regularly combined by a plurality of units with the same function, and that the memory may be easily replicated and shared, spares of any other logics on the SoC usually cost a lot. Without a spare, the complete chip will become useless and have to be discarded when the original circuit block is failed.

Currently, a stacked structure of chips has already been widely discussed, in which chips with different functions or different manufacturing technologies may be integrated by distributing stacked chips in a vertical direction, different from that a complete system is integrated in a single chip in the past. A semiconductor stacked structure is disclosed in U.S. Pat. No. 5,946,545. In the structure, a control chip is disposed on a chip to manage a manner of connecting stacked chips. A backup control chip is used to manage the use of backup of the stacked chips in a programmed manner, or a fuse is embedded in the control chip directly without a backup control chip to manage the use of backup of the stacked chips in a programmed manner. In the semiconductor stacked structure, the control chip and a programmed circuit (a backup control chip or a fuse) manages a backup circuit or a backup chip within the stacked chips through a through silicon via (TSV), so as to repair the chip. However, the semiconductor stacked structure is only applicable to chips normally connected, that is, each chip in the stack has to be normal. Otherwise, when the backup circuit or the backup chip is failed, the complete chip stack may be totally useless and have to be discarded.

SUMMARY

In an embodiment, the present disclosure is directed to a method for repairing a chip. First, a first chip is provided. The first chip includes a first circuit block with a first function, a second circuit block with a second function, and a signal path electrically connected to the first circuit block and the second circuit block. A first verification result is obtained by verifying a function of the first chip. A second chip is provided. The second chip includes a third circuit block with the first function. A second verification result is obtained by verifying a function of the second chip. The first circuit block is disabled if the first verification result shows that the first circuit block of the first chip is defective. The third circuit block is electrically connected to the signal path to replace the first circuit block and provide the first function if the first verification result shows that the second circuit block of the first chip is functional, and the second verification result shows that the third circuit block of the second chip is functional.

In another embodiment, the present disclosure is directed to a stacked structure of chips. The stacked structure of chips includes a first chip and a second chip. The first chip includes a first circuit block, a second circuit block, a signal path, a first hardwired switch, and a second hardwired switch. The first circuit block includes a first power terminal and a first signal terminal, and has the first function. The second circuit block includes a second signal terminal, and has a second function. The signal path is connected between the first signal terminal and the second signal terminal. The first hardwired switch is connected to the first power terminal. The second hardwired switch is connected to the signal path. The second chip and the first chip stack with each other. The second chip includes a third circuit block, a third hardwired switch, and a fourth hardwired switch. The third circuit block includes a third power terminal and a third signal terminal, and has the first function. The third hardwired switch is connected to the third power terminal, and is electrically connected to the first hardwired switch. The fourth hardwired switch is connected to the third signal terminal, and is electrically connected to the second hardwired switch. If the first circuit block is defective and the second circuit block and the third circuit block are functional, the first hardwired switch and the third hardwired switch are set correspondingly such that a power-supply bonding pad is connected to the third power terminal and disconnected to the first power terminal, and the second hardwired switch and the fourth hardwired switch are set correspondingly such that the third signal terminal is electrically connected to the signal path to make the third circuit block replace the first circuit block and provide the first function.

To make the features and advantages more comprehensible, detailed illustrations is given below with reference to the accompanying drawings with the embodiments in the following.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
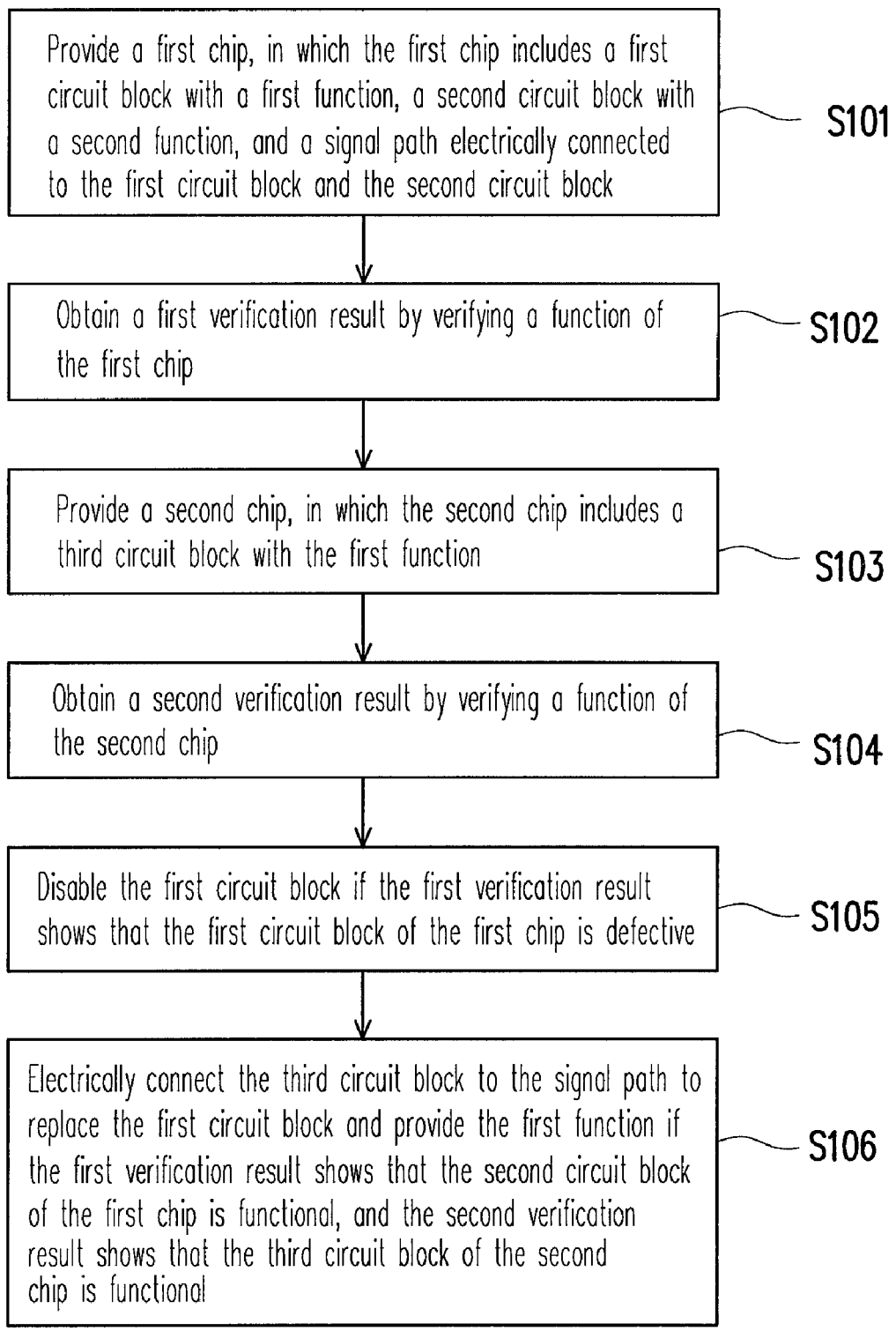
FIG. 1 is a flow chart of a method for repairing a chip according to an embodiment.

Reference will now be made in detail to the present embodiments of the invention, examples of which are illustrated in the accompanying drawings. Wherever possible, the same reference numbers are used in the drawings and the description to refer to the same or like parts.

In the manufacturing process of an integrated circuit, some chips are unable to pass product verification due to various factors. In the prior art, the chips unable to pass the product verification (referred to as defective chips) may be discarded. With further analysis on these defective chips, usually only functions of a part of elements or lines in the chips are abnormal, and the rest circuits in the chip are functional. It is very wasteful to discard a complete chip unwillingly due to that only a part of circuits are abnormal, especially for an integrated circuit product having a high unit price. In the following embodiments, a method for repairing a chip is disclosed. The method may incorporate a plurality of defective chips into a functional product, so as to reduce the number of discarded chips (defective chips).

Figure 2A:
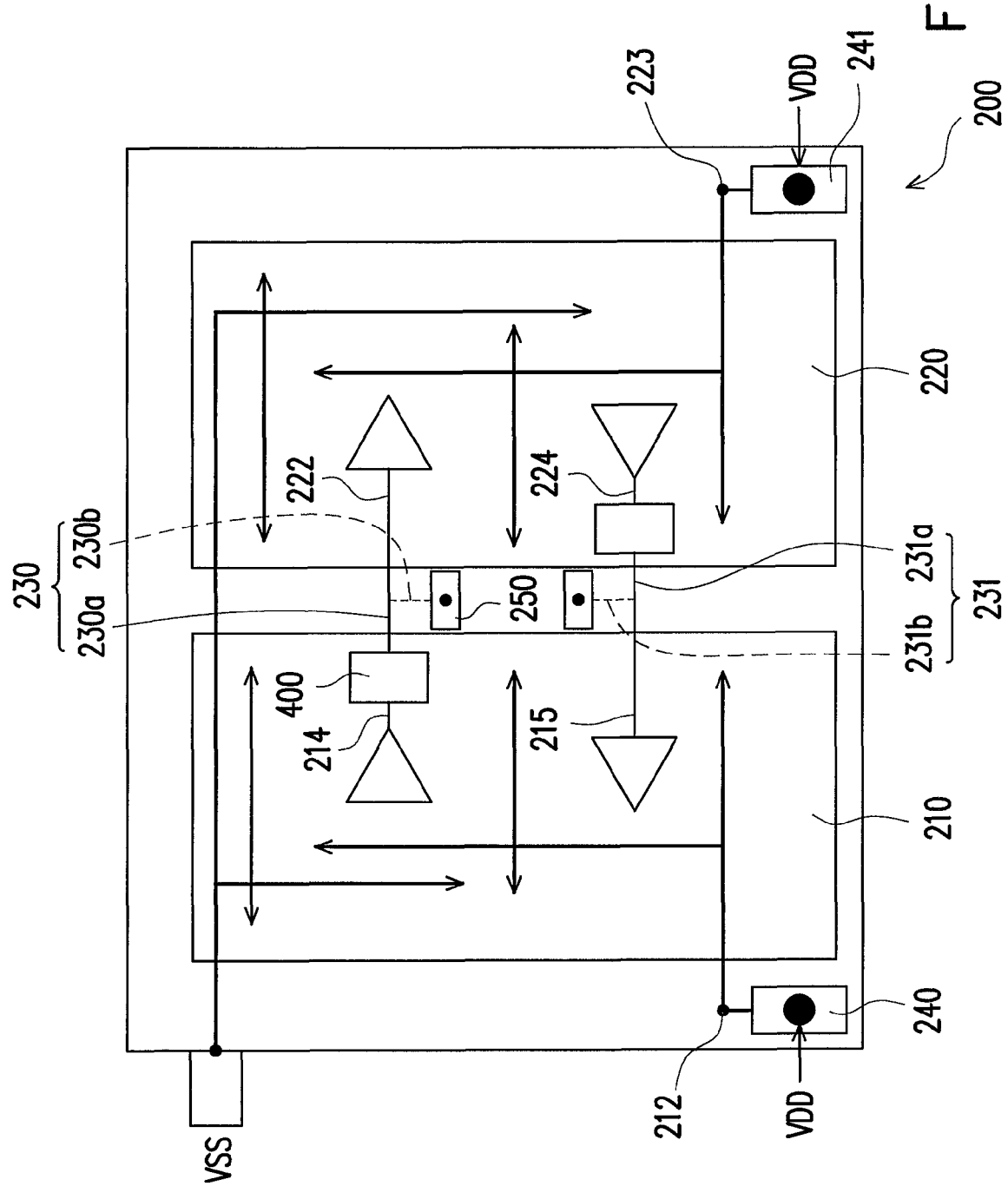
FIG. 2A is a schematic view of a first chip according to an embodiment.

FIG. 1 is a flow chart of a method for repairing a chip according to an embodiment. FIG. 2A is a schematic view of a first chip according to an embodiment. A first chip 200 may be partitioned into a plurality of circuit blocks in advance, and each circuit block has an independent power terminal. In this embodiment, it is set that the first chip 200 is partitioned into two circuit blocks in advance, namely, a first circuit block 210 and a second circuit block 220. In addition, in this embodiment, it is set that the first circuit block 210 and the second circuit block 220 have an independent first power terminal 212 and an independent second power terminal 223 respectively, and ground terminals of the first circuit block 210 and the second circuit block 220 are connected in parallel so as to be coupled to an external ground voltage VSS. By configuring a hardwired switch 240, an external system voltage VDD may provide electric energy for operation to the first circuit block 210 through the first hardwired switch 240 and the first power terminal 212. Similarly, by configuring a hardwired switch 241, the external system voltage VDD may also provide electric energy for operation to the second circuit block 220 through the hardwired switch 241 and the second power terminal 223. Thus, according to the configuration of the first hardwired switch 240 and the second hardwired switch 241, that is, according to whether the electric energy for operation is provided or not, whether the first circuit block 210 and the second circuit block 220 are disabled may be controlled.

In FIG. 2A, a signal path 230 between the first circuit block 210 and the second circuit block 220 is shown in a simplified manner. For example, only an internal signal path 230a connected between the first signal terminal 214 and the second signal terminal 222 and an external signal path 230b required during repair are shown. The internal signal path 230a represents a path that the first circuit block 210 outputs a signal to the second circuit block 220. The external signal path 230b is connected to the second hardwired switch 250 to transmit a signal of the first signal terminal 214 or the second signal terminal 222 to a circuit block on other chips during repair. Additionally, the signal path 231 also has an internal signal path 231a connected between a signal terminal 215 and a signal terminal 224 at the same time, which represents a path that the second circuit block 220 outputs a signal to the first circuit block 210, and further has an external signal path 231b connected to the hardwired switch during repair. In the following embodiments, only the first signal terminal 214, the signal path 230, and the second signal terminal 222 are taken as examples for illustration, and other signal paths may refer to the illustration.

Referring to FIGS. 1 and 2A at the same time, a method for repairing a chip according to this embodiment is shown. First, in Step S101, a first chip 200 is provided. As discussed above, the first chip 200 includes a first circuit block 210 with a first function, a second circuit block 220 with a second function, and a signal path 230 electrically connected between the first circuit block 210 and the second circuit block 220. The first circuit block 210 includes a first power terminal 212 and a first signal terminal 214, and the second circuit block 220 includes a second power terminal 223 and a second signal terminal 222. The signal path 230 is connected between the first signal terminal 214 and the second signal terminal 222.

Next, in Step S102, a first verification result is obtained by verifying a function of the first chip 200. The first verification result includes whether the first function of the first circuit block 210 is normal or not and whether the second function of the second circuit block 220 is normal or not. It is assumed here that the first verification result shows that the first circuit block 210 is defective and the second circuit block 220 is functional.

Figure 2B:
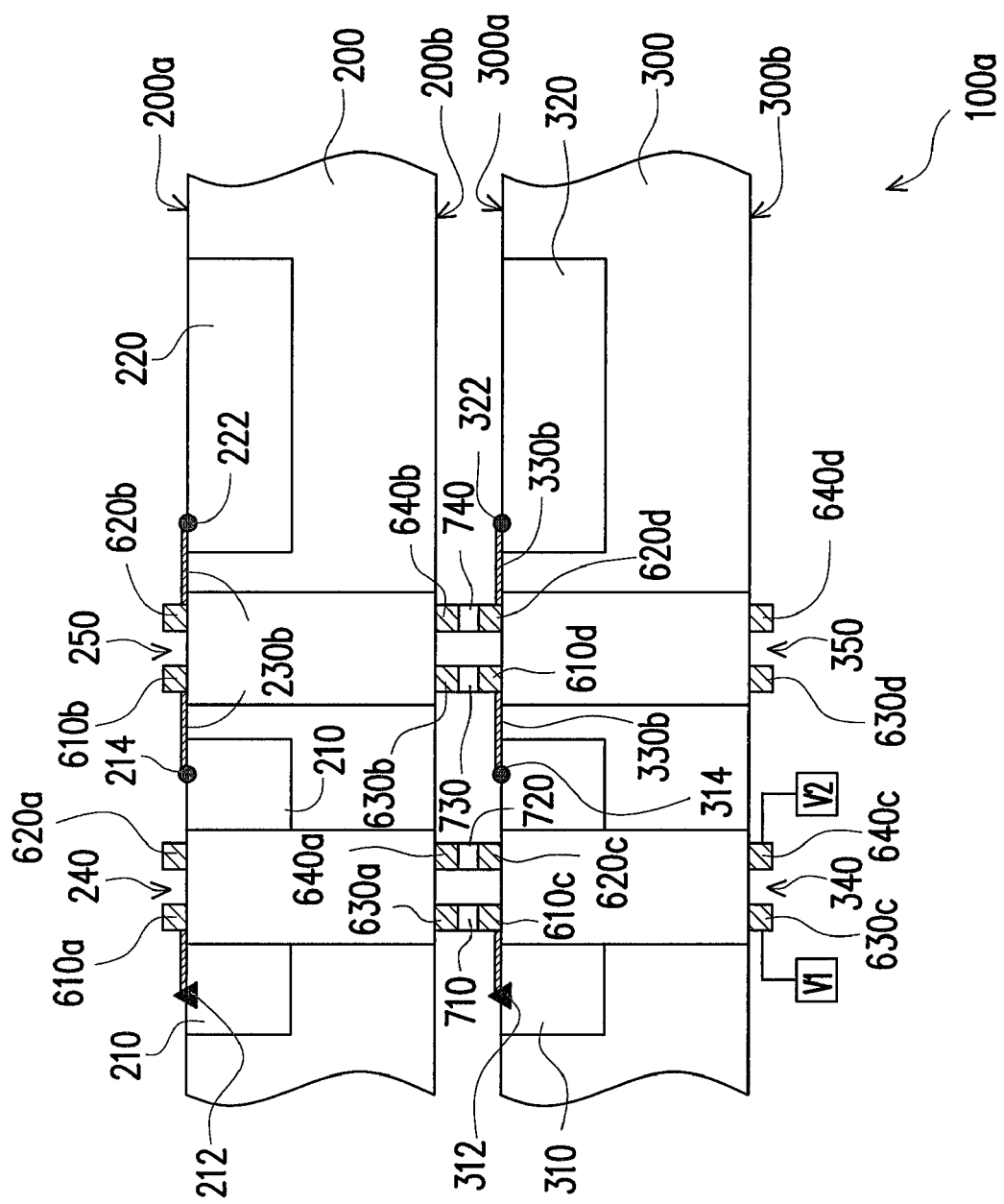
FIG. 2B is a schematic view of a first chip and a second chip stacking with each other according to an embodiment.

FIG. 2B is a schematic view of the first chip 200 and the second chip 300 stacking with each other according to an embodiment. The power terminals of the second circuit block 220 and the fourth circuit block 320 as well as the internal signal path 230a of the first chip 200 and an internal signal path of the second chip 300 are not shown in FIG. 2B, and the hardwired switches for conducting power to the second circuit block 220 and the fourth circuit block 320 are also not shown. A power supply switching mechanism of the second circuit block 220 and the fourth circuit block 320 may be obtained with reference to the related illustrations of the first circuit block 210 and the third circuit block 310. It should be noted that operations such as "verification", "configuring a hardwired switch" in Steps S103, S104, S105, and S106 are completed before the first chip 200 and the second chip 300 stack with each other.

Next, referring to FIGS. 1 and 2B, in Step S103, a second chip 300 is provided. The second chip 300 includes a third circuit block 310 with a first function, a fourth circuit block 320 with a second function, and a signal path electrically connected between the third circuit block 310 and the fourth circuit block 320. The third circuit block 310 includes a third power terminal 312 and a third signal terminal 314. The fourth circuit block 320 includes a fourth signal terminal 322. The signal path connects the third signal terminal 314 and the fourth signal terminal 322. It should be noted here that in this embodiment, although the function of the fourth circuit block 320 and the function of the second circuit block 220 of the first chip 200 are the same, in other embodiments, the function of the fourth circuit block 320 may also be different from the function of the second circuit block 220 of the first chip 200. In addition, a signal path of the second chip 300 is with the same as the signal path 230 of the first chip 200, that is, the signal path includes an internal signal path and an external signal path 330b. Here, the signal path connecting the third signal terminal 314 and the fourth signal terminal 322 is the internal signal path (for example, the internal signal path 230a as shown in FIG. 2A), the signal path connected to the fourth hardwired switch 350 during the subsequent repair is the external signal path 330b.

Next, in Step S104, a second verification result is obtained by verifying the function of the second chip 300. The second verification result includes whether the first function of the third circuit block 310 is normal or not and whether the second function of the fourth circuit block 320 is normal or not. It is assumed here that the second verification result shows that the third circuit block 310 is functional and the fourth circuit block 320 is defective.

Next, in Step S105, the first circuit block 210 is disabled if the first verification result shows that the first circuit block 210 of the first chip 200 is defective. Based on the situation assumed in the embodiment, that is, the second circuit block 220 and the third circuit block 310 are functional, while the first circuit block 210 and the fourth circuit block 320 are defective, the first circuit block 210 and the fourth circuit block 320 are disabled by setting configuration of each hardwired switch adapted to conduct power in the first chip 200 and the second chip 300. For example, a voltage source V1 (for example, a ground voltage VSS) is electrically connected to the first power terminal 212, and a voltage source V2 (for example, a system voltage VDD) is electrically connected to the third power terminal 312 by configuring the first hardwired switch 240 and the third hardwired switch 340. Thus, the first circuit block 210 is disabled due to the loss of power, and the third circuit block 310 is enabled because of obtaining the electric energy for operation.

In Step S106, if the first verification result shows that the second circuit block 220 of the first chip 200 is functional, and the second verification result shows that the third circuit block 310 of the second chip 300 is functional, the third circuit block 310 is electrically connected to the external signal path 230b of the first chip 200 to replace the first circuit block 210 and provide the first function. Based on the situation assumed in this embodiment, that is, the second circuit block 220 and the third circuit block 310 are functional, and the first circuit block 210 and the fourth circuit block 320 are defective, the third circuit block 310 may replace the first circuit block 210 to provide the first function by configuring each hardwired switch adapted to conduct a signal in the first chip 200 and the second chip 300. For example, the third signal terminal 314 of the third circuit block 310 is electrically connected to the external signal path 230b of the first chip 200 through the second hardwired switch 250 and the fourth hardwired switch 350 by configuring the second hardwired switch 250 and the fourth hardwired switch 350.

Specifically, referring to FIG. 2B again, according to the first verification result and the second verification result in Steps 105 and 106, the first hardwired switch 240 and the second hardwired switch 250 of the first chip 200 are configured correspondingly, and the third hardwired switch 340 and the fourth hardwired switch 350 of the second chip 300 are configured correspondingly. Subsequently, the first chip 200 and the second chip 300 are stacked, such that the first circuit block 210 and third circuit block 310 are disposed correspondingly in a vertical direction, and that the second circuit block 220 and the fourth circuit block 320 are disposed correspondingly in the vertical direction. The first hardwired switch 240 is connected to the first power terminal 212. The third hardwired switch 340 is connected to the third power terminal 312 and is electrically connected to the first hardwired switch 240. The second hardwired switch 250 is connected to the external signal path 230b. The fourth hardwired switch 350 is connected to the third signal terminal 314 and is electrically connected to the second hardwired switch 250.

Figure 2C:
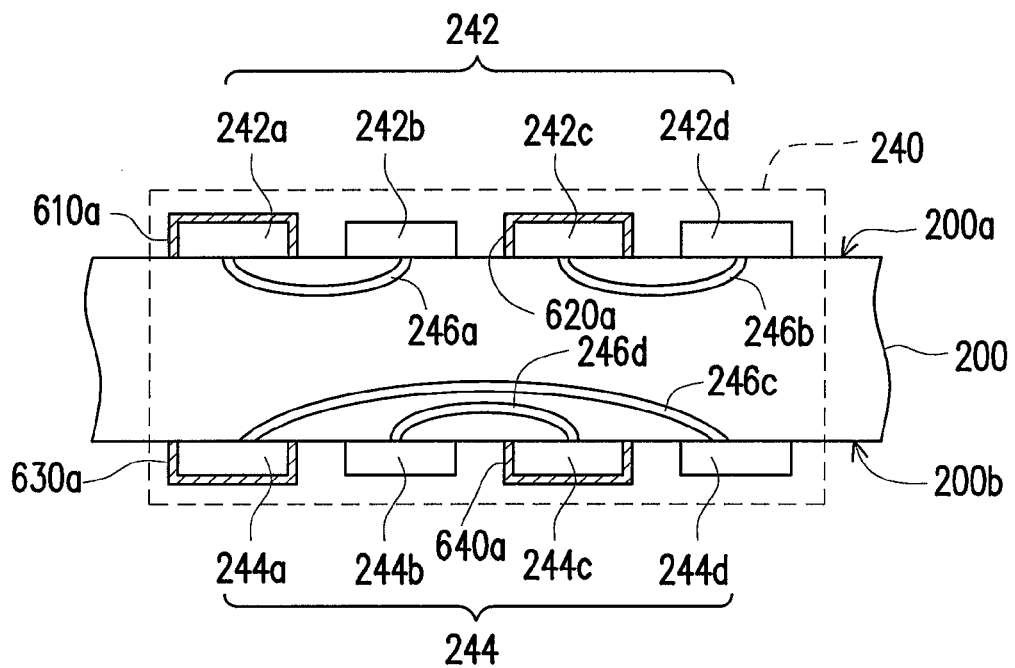
FIG. 2C is a schematic view of a hardwired switch of the first chip in FIG. 2B.
Figure 2D:
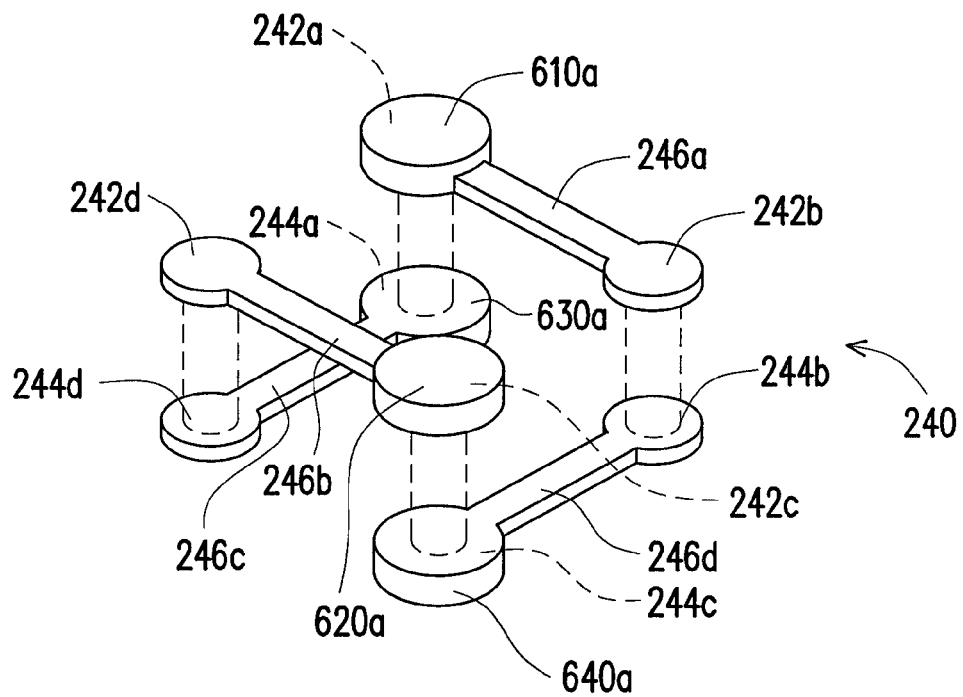
FIG. 2D is a partially enlarged three-dimensional view of the hardwired switch of the first chip in FIG. 2C.

FIG. 2C is a schematic view of a hardwired switch of a first chip in FIG. 2B. FIG. 2D is a partially enlarged three-dimensional view of a hardwired switch of a first chip in FIG. 2C. It should be noted here that as structure designs of the first hardwired switch 240, the second hardwired switch 250, the third hardwired switch 340, and the fourth hardwired switch 350 in this embodiment are basically the same, so only the first hardwired switch 240 is taken as an example for illustration below. Referring to FIGS. 2C and 2D at the same time, in this embodiment, the first hardwired switch 240 of the first chip 200 includes a first set of landing pads 242 and a second set of landing pads 244. The first set of landing pads 242 is disposed on a first surface 200a of the first chip 200, and includes a first landing pad 242a, a second landing pad 242b, a third landing pad 242c, and a fourth landing pad 242d. The second set of landing pads 244 is disposed on a second surface 200b of the first chip 200, and includes a fifth landing pad 244a, a sixth landing pad 244b, a seventh landing pad 244c, and an eighth landing pad 244d. The first landing pad 242a and the second landing pad 242b, the third landing pad 242c and the fourth landing pad 242d, the fifth landing pad 244a and the eighth landing pad 244d, as well as the sixth landing pad 244b and the seventh landing pad 244c are electrically connected through a first wire 246a, a second wire 246b, a third wire 246c, and a fourth wire 246d, respectively. In particular, in this embodiment, the first landing pad 242a and the fifth landing pad 244a, the second landing pad 242b and the sixth landing pad 244b, the third landing pad 242c and the seventh landing pad 244c, as well as the fourth landing pad 242d and the eighth landing pad 244d overlap partially or completely in a vertical direction of the first chip 200, and in FIG. 2D, for example, they overlap completely.

In addition, referring to FIG. 2D, a first bonding pad 610a, a second bonding pad 620a, a third bonding pad 630a, and a fourth bonding pad 640a may be disposed corresponding to positions of the first landing pad 242a, the third landing pad 242c, the fifth landing pad 244a, and the seventh landing pad 244c, respectively. The first bonding pad 610a, the second bonding pad 620a, the third bonding pad 630a, and the fourth bonding pad 640a are electrically connected to the first landing pad 242a, the third landing pad 242c, the fifth landing pad 244a, and the seventh landing pad 244c, respectively, so as to be electrically connected to the external. In this embodiment, the bonding pads may cover the landing pads. It should be noted that in this embodiment, the manner of disposing the bonding pads is not limited. Compared with FIG. 2D, in which the third bonding pad 630a and the fourth bonding pad 640a are disposed corresponding to the fifth landing pad 244a and the seventh landing pad 244c, respectively, in another embodiment not shown, the third bonding pad 630a and the fourth bonding pad 640a may also cover the sixth landing pad 244b and the eighth landing pad 244d respectively, so as to be electrically connected to the external, which is still an available technical solution of the present invention and does not depart from the protection scope of the present disclosure.

In the above embodiment, it may be determined whether to selectively dispose a first through silicon via (TSV) 510 and/or a second TSV 520 between the first landing pad 242a and the fifth landing pad 244a, or between the second landing pad 242b and the sixth landing pad 244b, or between the third landing pad 242c and the seventh landing pad 244c, or between the fourth landing pad 242d and the eighth landing pad 244d of the first hardwired switch 240 (or the second hardwired switch 250, the third hardwired switch 340, or the fourth hardwired switch 350) or not according to the first verification result and the second verification result, so as to generate various transmission modes of power supply signals. This is illustrated with reference to FIGS. 2E to 2K below.

Figure 2E:
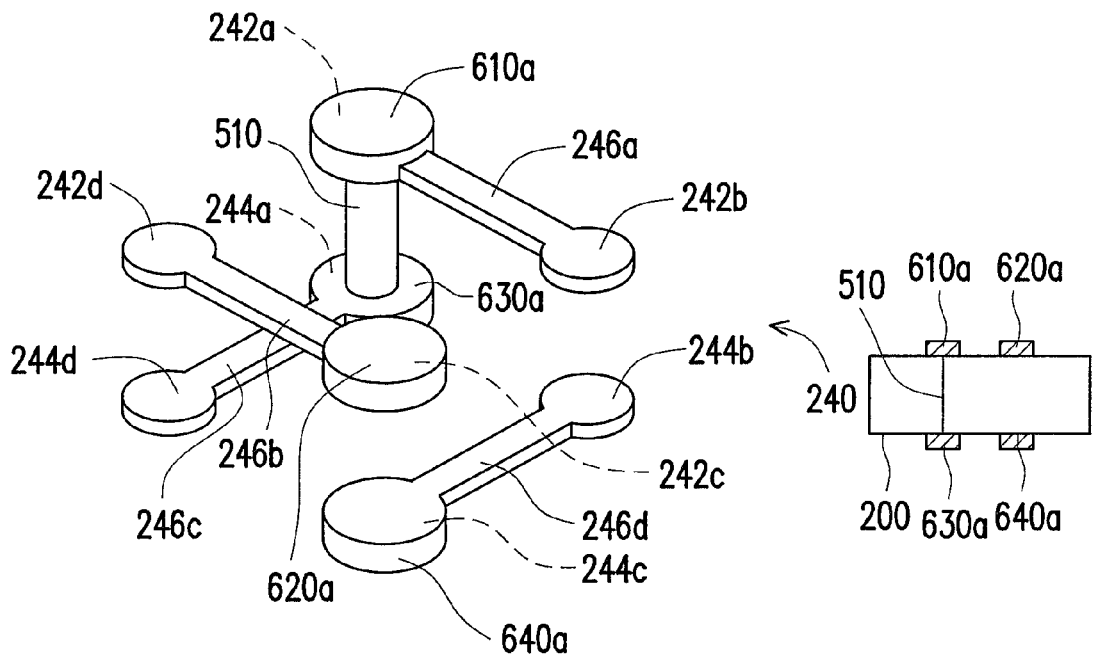
FIGS. 2E to 2K are partially enlarged three-dimensional views of hardwired switches according to a plurality of embodiments.

Referring to FIG. 2E, the first TSV 510 exists between the first landing pad 242a and the fifth landing pad 244a, and at this time the first bonding pad 610a, the first landing pad 242a, the first TSV 510, the fifth landing pad 244a, and the third bonding pad 630a form a path for transmitting power/signals. Thus, the power/signals may be transmitted between the first bonding pad 610a and the third bonding pad 630a.

Figure 2F:
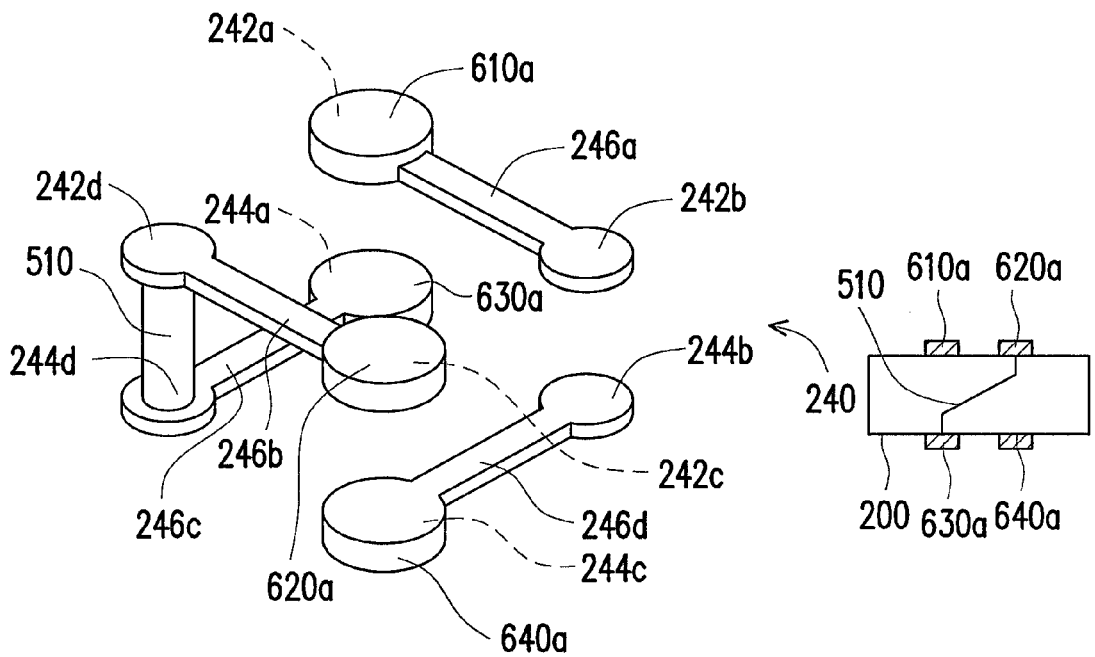

Referring to FIG. 2F, the first TSV 510 exists between the fourth landing pad 242d and the eighth landing pad 244d, and at this time the third bonding pad 630a, the fifth landing pad 244a, the third wire 246c, the eighth landing pad 244d, the first TSV 510, the fourth landing pad 242d, the second wire 246b, the third landing pad 242c, and the second bonding pad 620a form one path for transmitting power/signals. Thus, the power/signals may be transmitted between the third bonding pad 630a and the second bonding pad 620a.

Figure 2G:
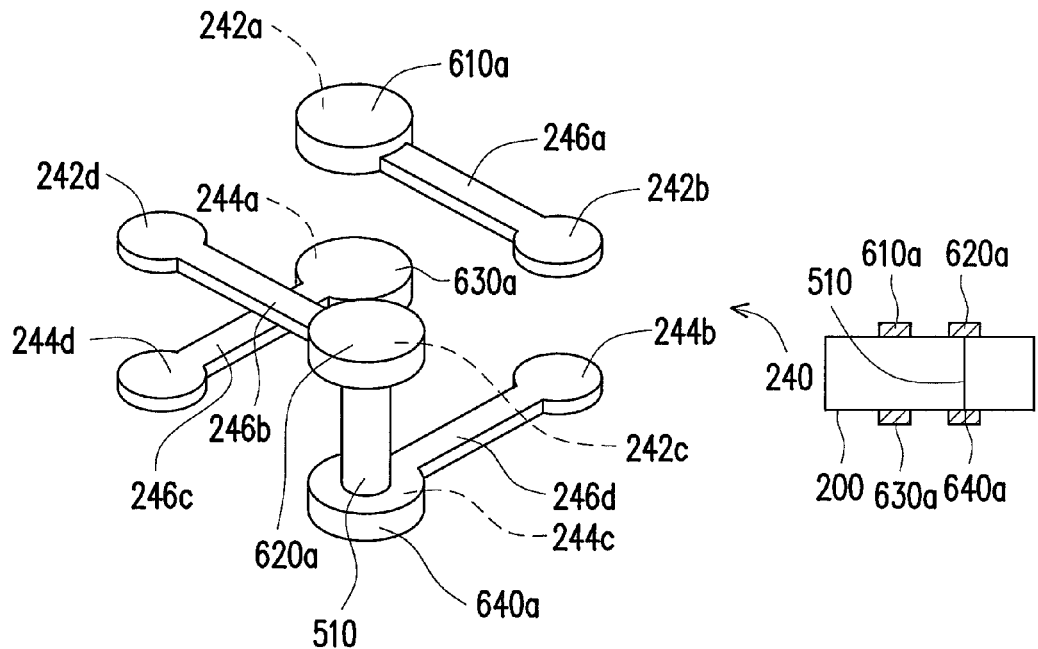

Referring to FIG. 2G, the first TSV 510 exists between the third landing pad 242c and the seventh landing pad 244c, and at this time the second bonding pad 620a, the third landing pad 242c, the first TSV 510, the seventh landing pad 244c, and the fourth bonding pad 640a form one path for transmitting power/signals. Thus, the power/signals may be transmitted between the second bonding pad 620a and the fourth bonding pad 640a.

Figure 2H:
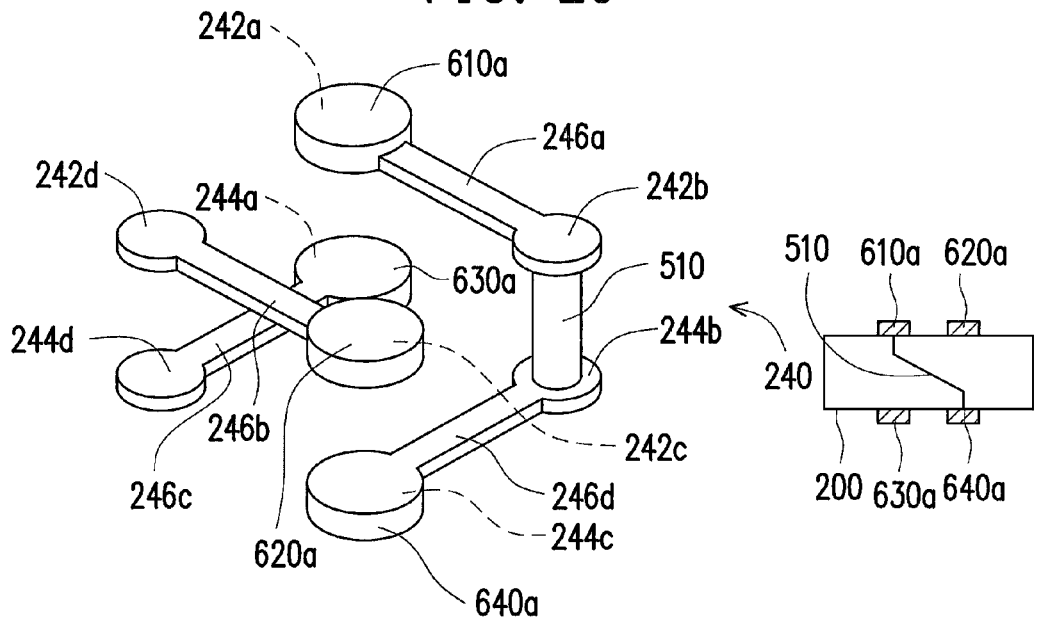

Referring to FIG. 2H, the first TSV 510 exists between the second landing pad 242b and the sixth landing pad 244b, and at this time the fourth bonding pad 640a, the seventh landing pad 244c, the fourth wire 246d, the sixth landing pad 244b, the first TSV 510, the second landing pad 242b, the first wire 246a, the first landing pad 242a, and the first bonding pad 610a form one path for transmitting power/signals. Thus, the power/signals may be transmitted between the fourth bonding pad 640a and the first bonding pad 610a.

Figure 2I:
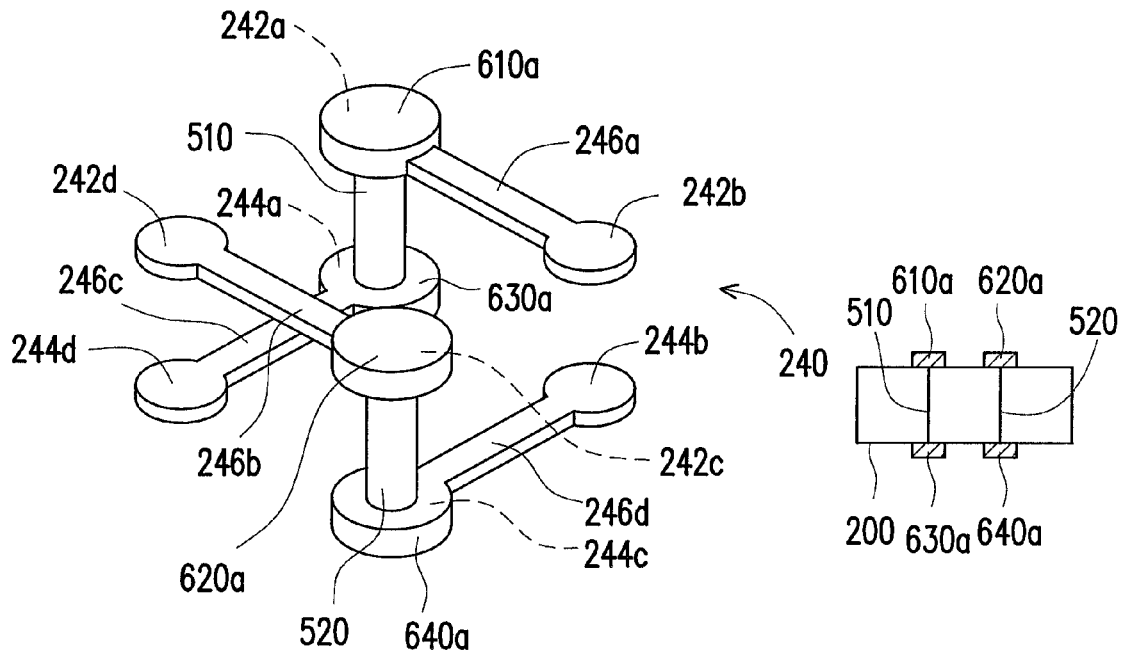

A hardwired switch disposed with two TSVs (referred to as a dual-TSV hardwired switch (DTHS)) is illustrated with reference to FIGS. 2I and 2J in the following. Referring to FIG. 2I, the first TSV 510 exists between the first landing pad 242a and the fifth landing pad 244a, and the second TSV 520 exists between the third landing pad 242c and the seventh landing pad 244c. At this time, the first bonding pad 610a, the first landing pad 242a, the first TSV 510, the fifth landing pad 244a, and the third bonding pad 630a form one path transmitting power/signals. The second bonding pad 620a, the third landing pad 242c, the second TSV 520, the seventh landing pad 244c, and the fourth bonding pad 640a form another path for transmitting power/signals. Thus, the power/signals may be transmitted between the first bonding pad 610a and the third bonding pad 630a, and the power/signals may be transmitted between the second bonding pad 620a and the fourth bonding pad 640a. Such a configuration manner that the power/signals are transmitted directly may be referred to as a through mode.

Figure 2J:
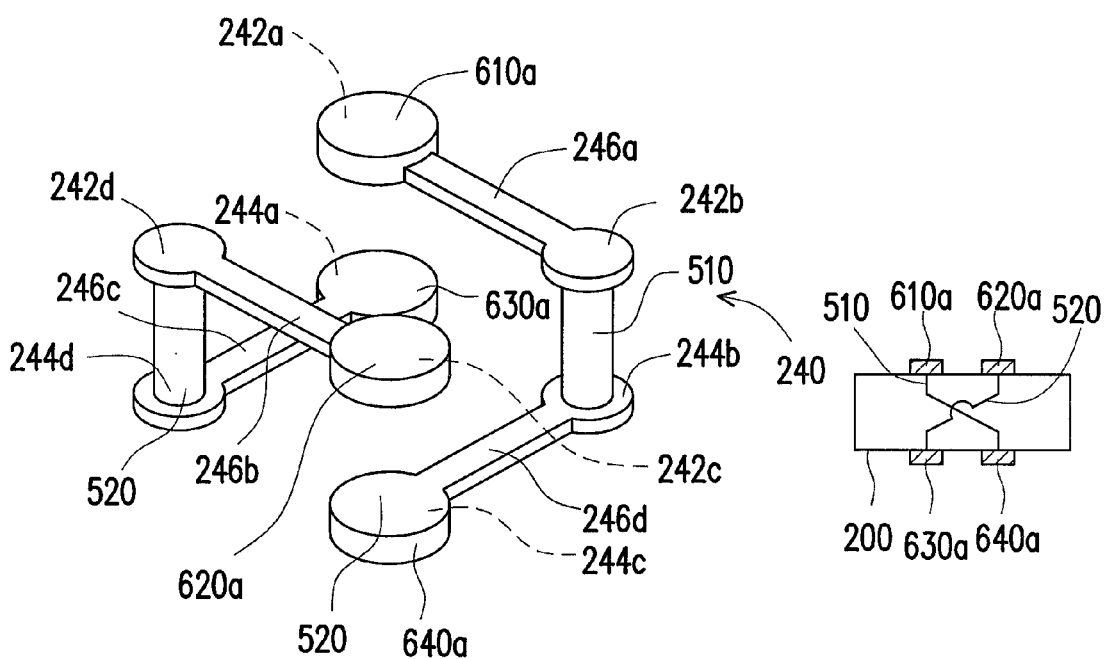

Referring to FIG. 2J, the first TSV 510 exists between the second landing pad 242b and the sixth landing pad 244b, and the second TSV 520 exists between the fourth landing pad 242d and the eighth landing pad 244d. At this time, the first bonding pad 610a, the first landing pad 242a, the first wire 246a, the second landing pad 242b, the first TSV 510, the sixth landing pad 244b, the fourth wire 246d, the seventh landing pad 244c, and the fourth bonding pad 640a form one path for transmitting power/signals. The second bonding pad 620a, the third landing pad 242c, the second wire 246b, the fourth landing pad 242d, the second TSV 520, the eighth landing pad 244d, the third wire 246c, the fifth landing pad 244a, and the third bonding pad 630a form another path for transmitting power/signals. Thus, the power/signals may be transmitted between the first bonding pad 610a and the fourth bonding pad 640a, and the power/signals may be transmitted between the second bonding pad 620a and the third bonding pad 630a. Such a configuration manner that the power/signals are transmitted through switching may be referred to as a cross mode.

It should be noted that besides the configuration manners that the power/signals are transmitted, in other embodiments not shown, two TSVs may also be disposed in other configuration, or three TSVs may be disposed on a single hardwired switch at the same time, or four TSVs may be disposed at the same time to form other types of modes for transmitting power/signals. Of course, a TSV may also not be disposed (as shown in FIG. 2D), such that the first set of landing pads 242 and the second set of landing pads 244 of the first hardwired switch 240 are not electrically connected.

Figure 2K:
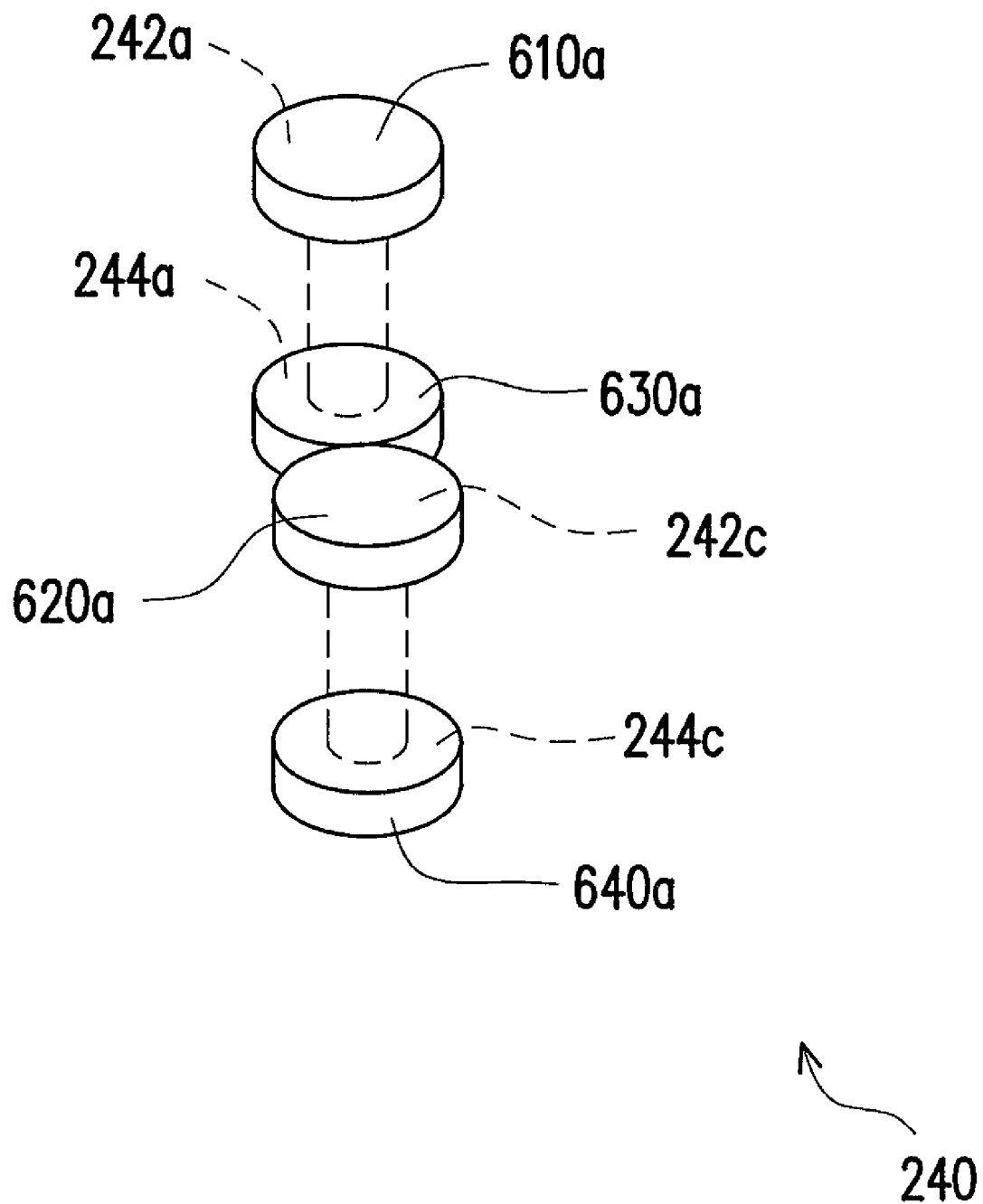

In addition, in other embodiments, referring to FIG. 2K, the first hardwired switch 240 may also only include the first landing pad 242a, the third landing pad 242c, the fifth landing pad 244a, the seventh landing pad 244c, the first bonding pad 610a disposed on the first landing pad 242a, the second bonding pad 620a disposed on the third landing pad 242c, the third bonding pad 630a disposed on the fifth landing pad 244a, and the fourth bonding pad 640a disposed on the seventh landing pad 244c, and one or two TSVs may also be disposed at the same time to form other types of modes for transmitting power/signals. Of course, a TSV may also not be disposed that two sides of the first chip 200 are not electrically connected, which is still an available technical solution of the present invention, and does not depart from the protection scope of the present disclosure.

In this embodiment, structure designs of the second hardwired switch 250, the third hardwired switch 340, and the fourth hardwired switch 350 are basically the same as that of the first hardwired switch 240. That is to say, structures of the second hardwired switch 250, the third hardwired switch 340, and the fourth hardwired switch 350 may be any structure of the first hardwired switch 240 in FIGS. 2D to 2K. The second hardwired switch 250 and the fourth hardwired switch 350 are different from the first hardwired switch 240 in that the first hardwired switch 240 is adapted to transmit power, while the second hardwired switch 250 and the fourth hardwired switch 350 are adapted to transmit data signals respectively.

Although all the hardwired switches shown in FIGS. 2B to 2K include four bonding pads, the present disclosure should not be limited thereto. For example, when the hardwired switch 250 is implemented as FIG. 2K, the third landing pad 242c, the seventh landing pad 244c, the second bonding pad 620a, and the fourth bonding pad 640a in FIG. 2K may be further omitted. In this example, the first landing pad 242a and the first bonding pad 610a (equivalent to the bonding pad 610b in FIG. 2B) are connected to the external signal path 230b through a redistribution layer (RDL) and/or a metal interconnection layer of the first chip 200. The fifth landing pad 244a and the third bonding pad 630a (equivalent to the bonding pad 630b in FIG. 2B) are electrically connected to the third circuit block 310 of the second chip 300 through a micro bump 730, a bonding pad 610d, and the external signal path 330b. Thus, when it intends to replace the first circuit block 210 with the third circuit block 310, only a TSV needs to be disposed between the first landing pad 242a and the fifth landing pad 244a, such that the signal terminal 314 of the third circuit block 310 may be electrically connected to the external signal path 230b.

Figure 2L:
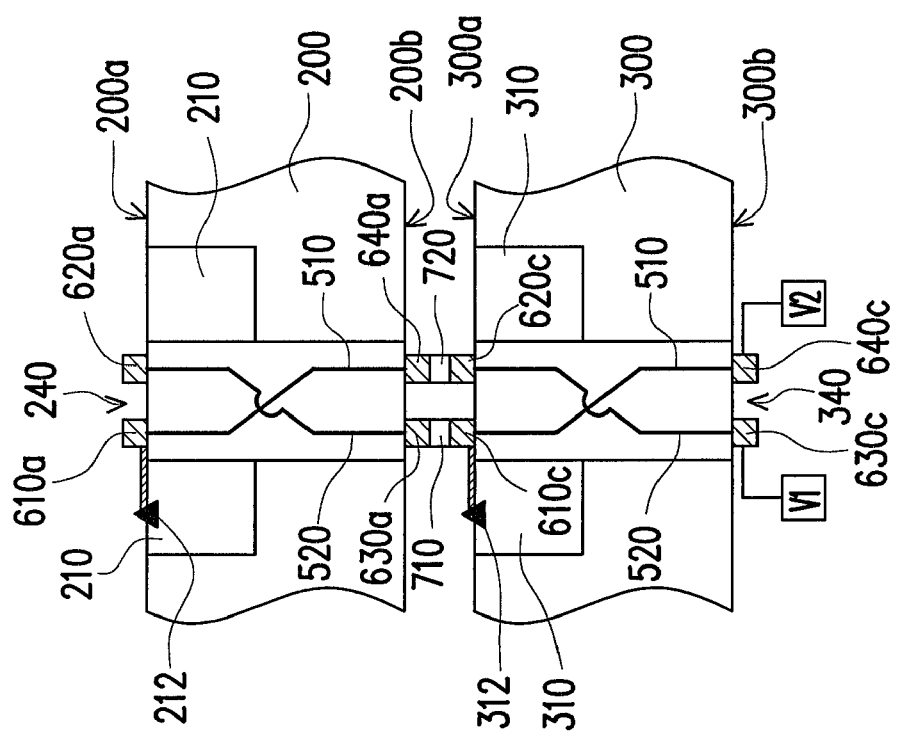
FIG. 2L is a schematic view of a first hardwired switch and a third hardwired switch in FIG. 2B.
Figure 2M:
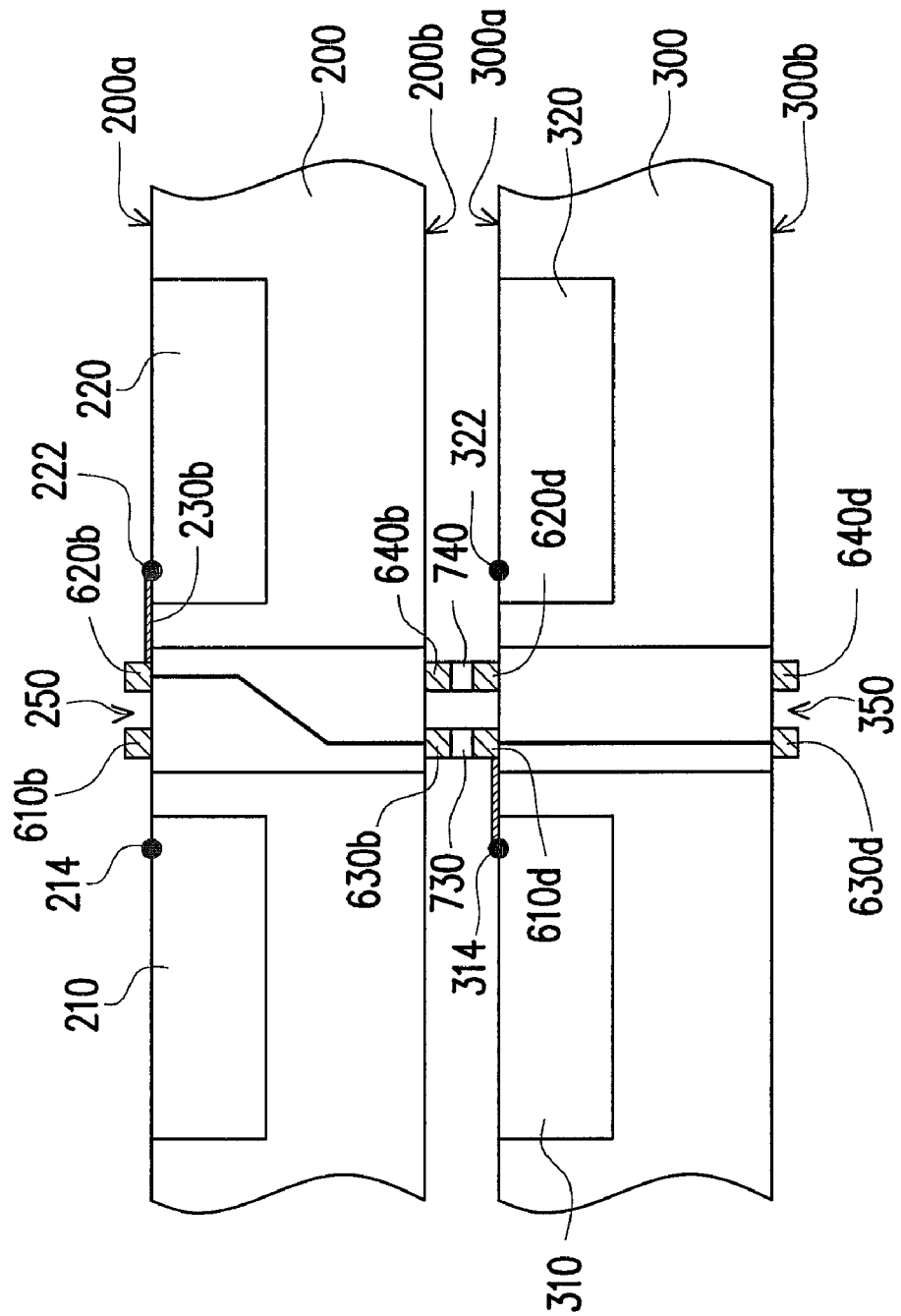
FIG. 2M is a schematic view of a second hardwired switch and a fourth hardwired switch in FIG. 2B.

FIG. 2L is a schematic view of a first hardwired switch and a third hardwired switch in FIG. 2B. FIG. 2M is a schematic view of a second hardwired switch and a fourth hardwired switch in FIG. 2B. In FIG. 2L, only the first bonding pad 610c and the second bonding pad 620c are used to denote the third set of landing pads disposed on a first surface 300a of the second chip 300. Additionally, the third bonding pad 630c and the fourth bonding pad 640c are used to denote the fourth set of landing pads disposed on a second surface 300b of the second chip 300. Similarly, the first bonding pad 610d and second bonding pad 620d are used to denote the third set of landing pads located at the fourth hardwired switch 350. Additionally, the third bonding pad 630c and the fourth bonding pad 640c are used to denote the fourth set of landing pads located at the fourth hardwired switch 350.

Referring to FIG. 2L, it is acquired that the third circuit block 310 is functional and the first circuit block 210 is defective according to the first verification result and the second verification result. Thus, before the chips are stacked, the first hardwired switch 240 and the third hardwired switch 340 are set as a "cross mode" first (referring to FIG. 2J and related illustrations). As defective circuit blocks in the chips are repaired in a manner of stacking chips (that is, the stack first chip 200 and the second chip 300) in this embodiment, such that the functional third circuit block 310 replaces the defective first circuit block 210. Thus, when the first chip 200 and the second chip 300 are stacked, the third bonding pad 630a and the fourth bonding pad 640a of the first hardwired switch 240 of the first chip 200 are electrically connected to the first bonding pad 610c and the second bonding pad 620c of the third hardwired switch 340 of the second chip 300 through a first conductive bump 710 and a second conductive bump 720 respectively. Thus, the voltage source V1 (for example, a ground voltage VSS) may be connected to the first power terminal 212 of the first block 210 through the power-supply bonding pad (that is, the third bonding pad 630c), the bonding pad 620c, the conductive bump 720, the bonding pad 640a, and the bonding pad 610a. A voltage source V2 (for example, a system voltage VDD) may be connected to the power terminal 312 of the third circuit block 310 through the power-supply bonding pad (that is, the fourth bonding pad 640c) and the bonding pad 610c. As the first circuit block 210 loses the electric energy for operation and the third circuit block 310 obtains the electric energy for operation, the first circuit block 210 is disabled and the third circuit block 310 is enabled.

Referring to FIG. 2M, it is acquired that the second circuit block 220 and the third circuit block 310 are functional, and the first circuit block 210 and the fourth circuit block 320 are defective according to the first verification result and the second verification result. Thus, before chips are stacked, the fourth hardwired switch 350 is set as a configuration as shown in FIG. 2E first (or, a TSV is not disposed at the fourth hardwired switch 350). The second hardwired switch 250 is additionally set as a configuration as shown in FIG. 2F. When the first chip 200 and the second chip 300 are stacked, the third bonding pad 630b and the fourth bonding pad 640b of the second hardwired switch 250 of the first chip 200 are electrically connected to the first bonding pad 610d and the second bonding pad 620d of the fourth hardwired switch 350 of the second chip 300 through a third conductive bump 730 and a fourth conductive bump 740, such that the signal terminal 314 of the third circuit block 310 is electrically connected to the external signal path 230b of the first chip 200 to replace the first circuit block 210.

In addition, in this embodiment, the first chip 200 further includes an isolation circuit 400 disposed between the first signal terminal 214 and the second signal terminal 222, referring to FIG. 2A. The isolation circuit 400 is used for selectively isolating a signal of the first signal terminal 214 from the signal path 230. That is to say, when the first circuit block 210 is disabled, the isolation circuit 400 may function as a shield, so as to avoid that the first signal terminal 214 of the first circuit block 210 interferes with the transmission of signals in the signal path 230.

Those of ordinary skill in the art may implement the isolation circuit 400 in any manner on demands. For example, the isolation circuit 400 is implemented by using a switch. In this embodiment, an NMOS may be used to implement the switch. The switch (not shown) is coupled between the first signal terminal 214 and the signal path 230, and a control terminal of the switch may be coupled to the first power terminal 212 of the first circuit block 210. When the first power terminal 212 receives a system voltage VDD, the first circuit block 210 is enabled, and the switch (not shown) is turned on. On the contrary, when the first power terminal 212 receives a ground voltage VSS, the first circuit block 210 is disabled, and the switch (not shown) is turned off. Thus, the isolation circuit 400 may function as a shield, so as to avoid that the first signal terminal 214 interferes with the transmission of signals in the signal path 230 when the first circuit block 210 is disabled.

The embodiment does not limit the implementation manner of the isolation circuit 400. Brief illustrations are given below for the isolation circuits 400a to 400d.

Figure 3A:
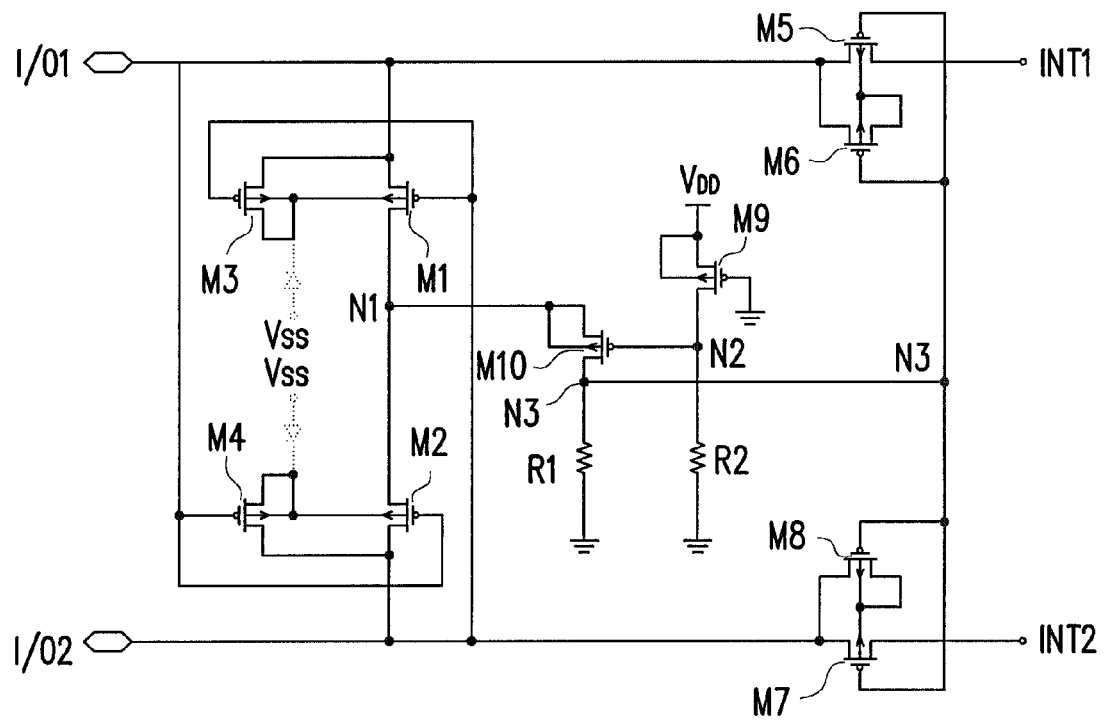
FIGS. 3A to 3D are schematic views of isolation circuits according to a plurality of embodiments.

FIGS. 3A to 3D are schematic views of isolation circuits according to a plurality of embodiments of the present invention. Referring to FIG. 3A first, an isolation circuit 400a is shown. An I/O1 and an I/O2 are external input/output pins of the chip. An INT1 and an INT2 are corresponding chip-internal signals. Transistors M1 to M10 and resistors R1 to R2 form the isolation circuit 400a. In brief, when the power supply $V_{DD}$ is turned off, a signal with higher voltage in both the I/O1 and I/O2 is transmitted to a signal point N1 through the M1 to M4. As the $V_{DD}$=0 (the power supply is grounded), the M9 is turned off. A signal point N2 is discharged to 0 V by the R2. At this time, the M10 is turned on, a signal point N3 has a potential equal to that of the N1. The N3 is connected to gates of the M5 to M8. Thus, the INT1 and the INT2 are isolated from the I/O1 and the I/O2. When the power supply is turned on, the I/O1 and the I/O2 are connected to the INT1 and the INT2 through the PMOS M5 and M8.

Figure 3B:
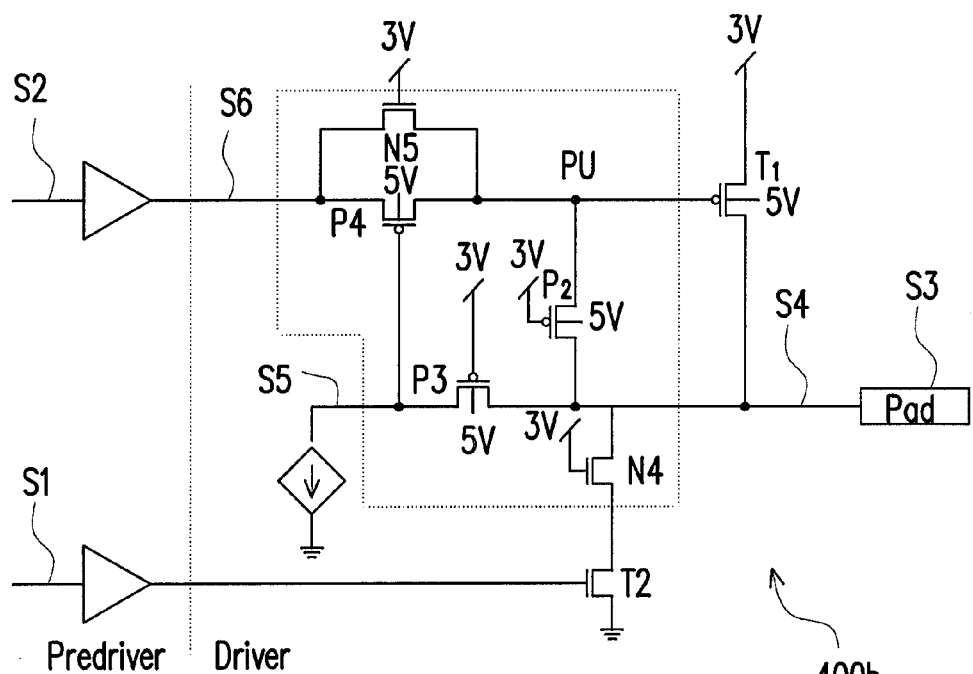

Referring to FIG. 3B, in a circuit with a pad design, the isolation circuit 400b is formed of the transistors P4, N5, P3, P2, and N4. In brief, when no signal is output, a signal line S1 is at a low potential and signal line S2 is at a high potential (3V). If a signal line S3 or S4 has a higher potential (5V) input at this time, the transistor P3 is turned on first. Thus, the signal line S5 is drawn to a higher potential. Moreover, the signal line PU is also forced to a higher potential through the transistor P2. In such a manner, the transistor T1 may be safely turned off. Since the gate of the transistor P4 and the signal line PU have equal potentials, and the gate of the transistor N5 and the signal line S6 have equal potentials, the signal lines S6 and S4 may be safely isolated.

Figure 3C:
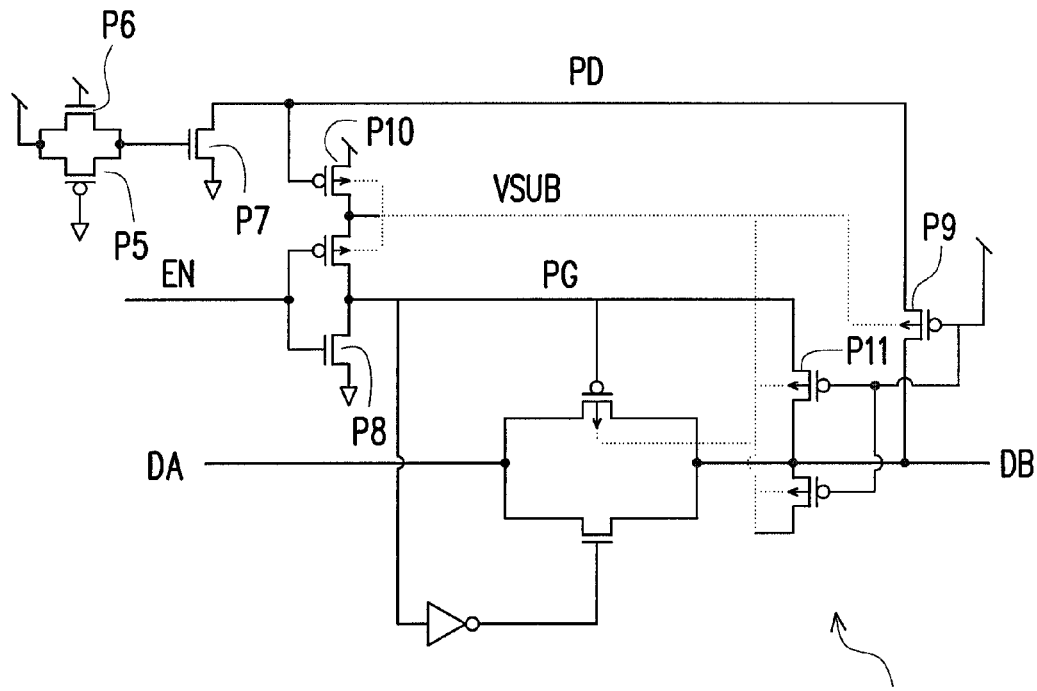

Referring to FIG. 3C, an EN is a control signal of an isolation circuit 400c. In brief, when the control signal EN is at a low potential, the isolation circuit 400c may isolate signal lines DA and DB. When the power supply is turned off, the transistors P5 and P6 are no longer able to control the transistor P7. Thus, at an initial stage, a voltage of the signal line PD assumes a floating state. At the same time, when the control signal EN is at a low potential, the transistor P8 is turned off. If a signal having a high potential exists in the signal line DB, the transistor P9 is turned on. At this time, the signal line PD and the signal line DB have equal potentials (the floating state is ended), and the transistor P10 is safely turned off due to the high potential of the signal line PD. On the other hand, a gate of the transistor P11 transmits the potential of the signal line DB to the signal line PG as the power supply is turned off. As the signal line PG and signal line DB have equal potentials, the signal line DA and the signal line DB may be safely isolated.

Figure 3D:
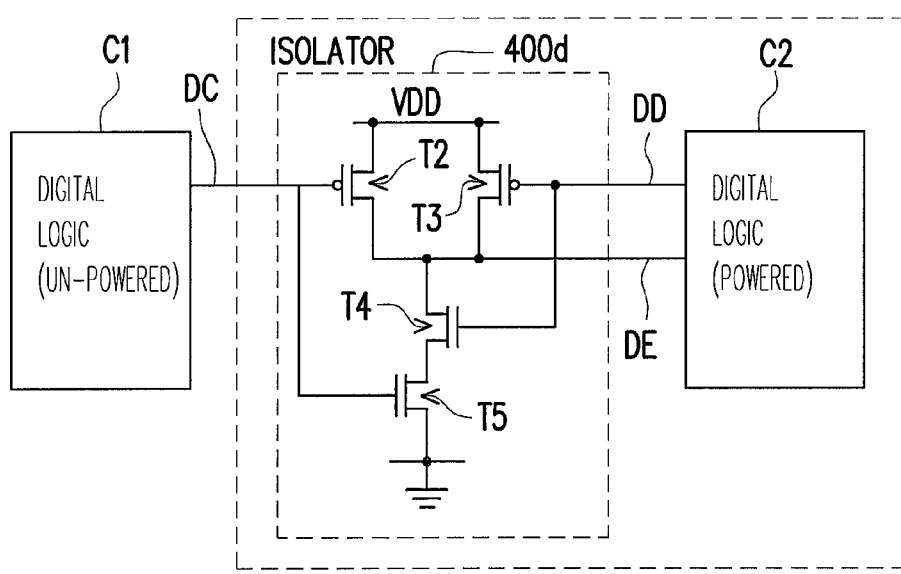

Referring to FIG. 3D, the transistors T1 to T5 form an isolation circuit 400d. In brief, when a power supply of the block C1 is turned on, the control signal DD is at a high potential. Thus, the transistors T2, T4, and T5 form an inverted output circuit outputting a signal D. The input signal DE and the output DC are constantly inverted. When the power supply of the block C1 is turned off, the control signal DD is at a low potential. Thus, the transistor T3 is turned on constantly. The input signal DE is constantly at a high potential. Thus, the output signal DC and the input signal DE are isolated.

In brief, as the method for repairing a chip in this embodiment includes stacking chips and selectively disposing TSVs in hardwired switches, the defective circuit block (for example, the first circuit block 210) of the first chip 200 may be replaced with a functional circuit block (for example, the third circuit block 310) of the second chip 300 having the same function, so as to form a stacked structure of chips 100 having complete product functions. In other words, a plurality of defective chips may be incorporated into a functional product, so as to reduce the number of the discarded chips (defective chips). In addition, TSVs are selectively disposed in the hardwired switch according to the first verification result and the second verification result. Besides that a purpose of switching paths for transmitting signals and power may be achieved without changing the disposition of the conductive bump and the chip surface lines, the signals and power may also be prevented from being transmitted to the defective circuit blocks.

It should be noted that although only a type of stacking two chips is shown in the above embodiment, in other embodiments, if each chip includes more than two circuit blocks having different functions, a type of stacking a plurality of chips may also used to repair a chip. In addition, in other embodiments, the second circuit block 220 of the first chip 200 and the fourth circuit block 320 of the second chip 300 may also be selectively disposed with hardwired switches, so as to form different modes for transmitting power between the second circuit block 220 and the fourth circuit block 320. Three different embodiments are used to illustrate the stacked structures of chips 100b to 100d respectively below.

Figure 4:
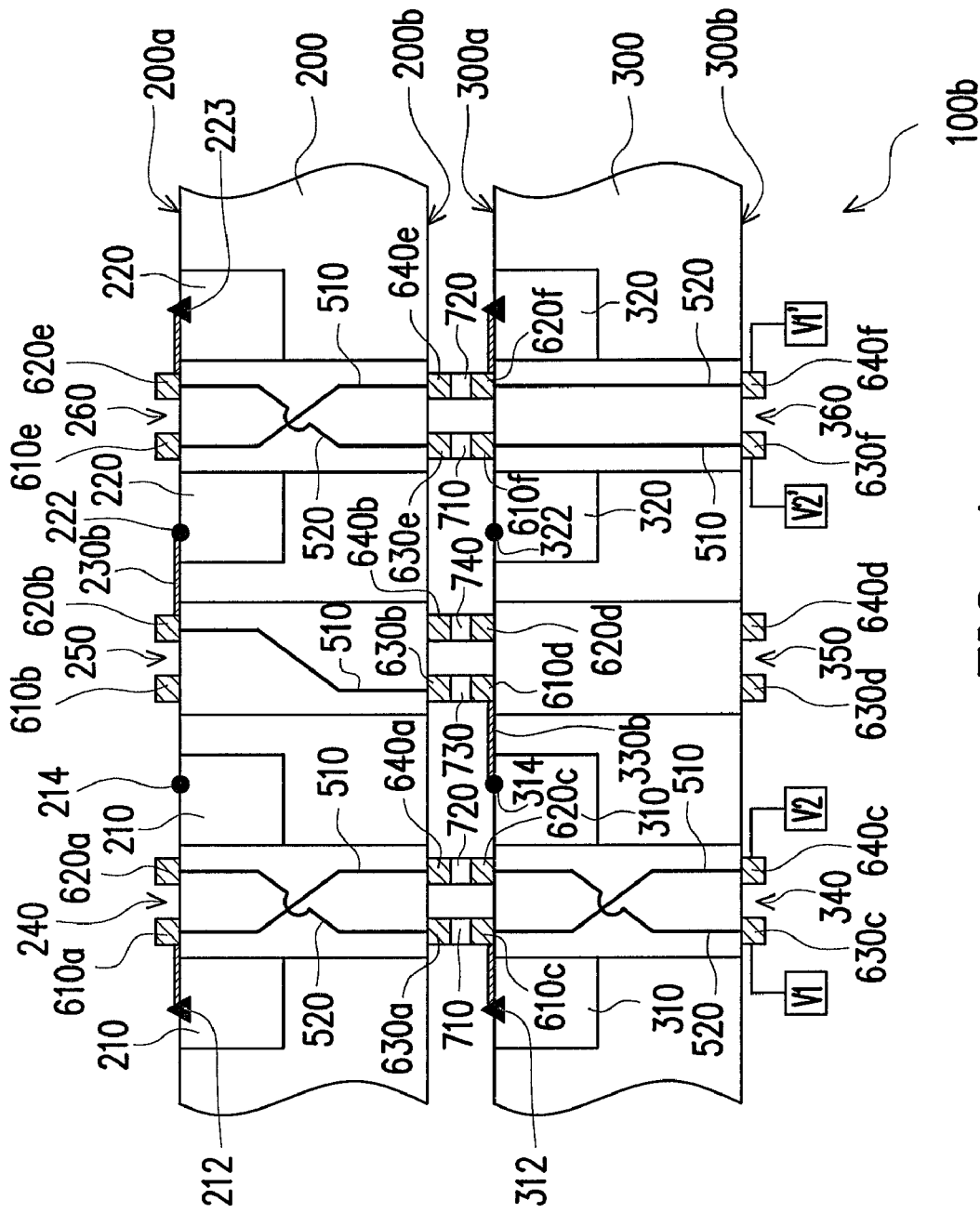
FIG. 4 is a schematic view of a stacked structure of chips according to an embodiment.

FIG. 4 is a schematic view of a stacked structure of chips according to an embodiment. It should be noted here that, a part of the signal path between the first chip 200 and the second chip 300 is not shown in FIG. 4 for ease of illustration. Referring to FIG. 4, in this embodiment, a stacked structure of chips 100b includes a first chip 200 and a second chip 300. The first chip 200 includes a first circuit block 210, a second circuit block 220, a signal path 230 (referring to FIG. 2A), a first hardwired switch 240, and a second hardwired switch 250. The first circuit block 210 includes a first power terminal 212 and a first signal terminal 214, and has a first function. The second circuit block 220 includes a second signal terminal 222 and a power terminal 223, and has a second function. The internal signal path 230b (referring to FIG. 2A) is connected between the first signal terminal 214 and the second signal terminal 222. The first hardwired switch 240 is connected to the first power terminal 212. The second hardwired switch 250 is connected to the external signal path 230b.

The second chip 300 and the first chip 200 stack with each other, and the second chip 300 has the same structure as that of the first chip 200. The second chip 300 includes a third circuit block 310, a fourth circuit block 320, a signal path (for example, the signal path 230 in FIG. 2A), a third hardwired switch 340, and a fourth hardwired switch 350. The third circuit block 310 includes a third power terminal 312 and a third signal terminal 314, and has the first function. The fourth circuit block 320 includes a fourth signal terminal 322, and has the second function, but the present disclosure is not limited thereto. The internal signal path (for example, the internal signal path 230a in FIG. 2A) is connected between the third signal terminal 314 and the fourth signal terminal 322. The third hardwired switch 340 is connected to the third power terminal 312 and is electrically connected to the first hardwired switch 240. The fourth hardwired switch 350 is connected to the third signal terminal 314 and the fourth signal terminal 322 and is electrically connected to the second hardwired switch 250. It should be noted here that structures of the first hardwired switch 240, the second hardwired switch 250, the third hardwired switch 340, and the fourth hardwired switch 350 and specific disposition manner of the through silicon via (TSV) may be obtained with reference to FIGS. 2C to 2K, and the descriptions of which are not repeated here.

If the first circuit block 210 of the first chip 200 is defective, the second circuit block 220 of the first chip 200 and the third circuit block 310 of the second chip 300 are both functional, and when a voltage source V1 (for example, a ground voltage VSS) is connected to the third bonding pad 630c of the second chip 300 and a voltage source V2 (for example, a system voltage VDD) is connected to the fourth bonding pad 640c of the second chip 300, TSVs may be disposed in the first hardwired switch 240 of the first chip 200 and in the third hardwired switch 340 of the second chip 300 in the manner as shown in FIG. 2J, such that operations of the first hardwired switch 240 and the third hardwired switch 340 are in a cross mode. In such a manner of disposing TSVs, the voltage source V1 supplies the ground voltage VSS to the first circuit block 210 through the third bonding pad 630c, the second TSV 520 of the third hardwired switch 340, the second bonding pad 620c, the second conductive bump 720, the fourth bonding pad 640a, the first TSV 510 of the first hardwired switch 240, and the first bonding pad 610a in sequence. The voltage source V2 supplies a system voltage VDD to the third circuit block 310 through the fourth bonding pad 640c, the first TSV 510 of the third hardwired switch 340, and the first bonding pad 610c in sequence. In other words, the voltage source V2 does not supply the system voltage VDD to the first circuit block 210 of the first chip 200, that is, the first circuit block 210 of the first chip 200 is disabled.

At this time, TSVs may be disposed in the second hardwired switch 250 of the first chip 200 in the manner as shown in FIG. 2F, and the TSVs are not disposed in the fourth hardwired switch 350. In such a manner of disposing the TSVs, the signal of the third signal terminal 314 is transmitted to the second signal terminal 222 of the second circuit block 220 of the first chip 200 through the first bonding pad 610d, the third conductive bump 730, the third bonding pad 630b, the first TSV 510 of the second hardwired switch 250, and a second bonding pad 620b in sequence. In brief, the third circuit block 310 of the second chip 300 is electrically connected to the external signal path 230b through the second hardwired switch 250 and the fourth hardwired switch 350. Thus, the third circuit block 310 is able to replace the first circuit block 210 of the first chip 200 to provide the first function.

In a similar way, at this time, if the second circuit block 220 of the first chip 200 is functional, and the fourth circuit block 320 of the second chip 300 is functional or defective, a fifth hardwired switch 260 may be selectively disposed in the second circuit block 220 and a sixth hardwired switch 360 may be selectively disposed in the fourth circuit block 320. When the voltage source V1' is connected to a fourth bonding pad 640f of the second chip 300 and a voltage source V2' is connected to a third bonding pad 630f of the second chip 300, TSVs may be disposed in the fifth hardwired switch 260 in manner as shown in FIG. 2J, or the TSVs may be disposed in the sixth hardwired switch 360 in a manner as shown in FIG. 2I. In such a manner of disposing the TSVs, the voltage source V1' supplies a ground voltage VSS to the fourth circuit block 320 through the fourth bonding pad 640f, the second TSV 520 of the sixth hardwired switch 360, and the second bonding pad 620f in sequence. The voltage source V2' supplies a system voltage VDD to the second circuit block 220 of the first chip 200 through the third bonding pad 630f, the first TSV 510 of the sixth hardwired switch 360, the first bonding pad 610f, the first conductive bump 710, the third bonding pad 630e, the second TSV 520 of the fifth hardwired switch 260, and the second bonding pad 620e in sequence. In other words, the voltage source V2' does not supply the system voltage VDD to the fourth circuit block 320 of the second chip 300, that is, the fourth circuit block 320 of the second chip 300 is disabled.

In brief, as the first circuit block 210 of the first chip 200 is defective, and the second circuit block 220 of the first chip 200 and the third circuit block 310 of the second chip 300 are functional, the first chip 200 and the second chip 300 are stacked and the TSVs are selectively disposed in the hardwired switches, such that the third circuit block 310 of the second chip 300 replaces the first circuit block 210 of the first chip 200 in function through the hardwired switches to form a stacked structure of chips 100b having complete functions (including the first function and the second function). Therefore, in this embodiment, the stacked structure of chips 100b may achieve a purpose of switching paths for transmitting signals and power without changing disposition manners of the conductive bump and the chip surface lines, and may prevent the signals and power from being transmitted to the defective circuit blocks.

Figure 5:
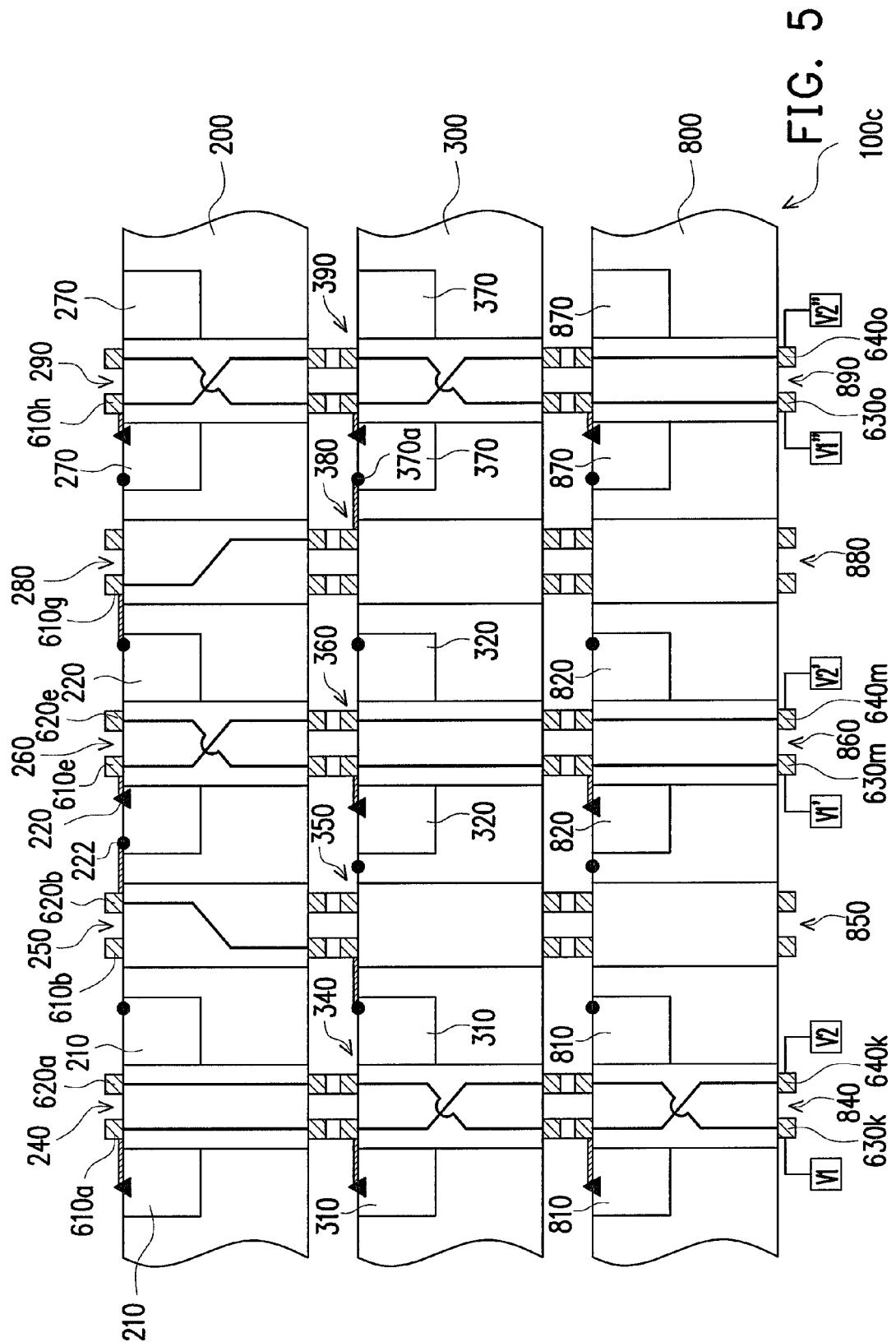
FIG. 5 is a schematic view of a stacked structure of chips according to another embodiment.

FIG. 5 is a schematic view of a stacked structure of chips according to another embodiment. Referring to FIG. 5, in this embodiment, the stacked structure of chips 100c includes a first chip 200, a second chip 300, and a third chip 800. The first circuit block 210 and a fifth circuit block 270 of the first chip 200 are defective, the third circuit block 310 and the fourth circuit block 320 of the second chip 300 are defective, an eighth circuit block 820 and a ninth circuit block 830 of the third chip 800 are defective. The first circuit block 210, the third circuit block 310, and the seventh circuit block 810 all have the first function, respectively. The second circuit block 220, the fourth circuit block 320, and the eighth circuit block 820 all have the second function, respectively. The fifth circuit block 270, the sixth circuit block 370, and the ninth circuit block 870 all have a third function, respectively.

Manners of disposing TSVs as shown in FIGS. 2I, 2F, 2J, 2H, and 2J are respectively selected in sequence for the hardwired switches 240, 250, 260, 280, and 290 of the first chip 200 of the stacked structure of chips 100c. Manners of disposing TSVs as shown in FIGS. 2J, 2E, 2I, and 2J are respectively selected in sequence for the hardwired switches 340, 350, 360, and 390 of the second chip 300. Manners of disposing TSVs as shown in FIGS. 2J, 2I, and 2I are respectively selected in sequence for the hardwired switches 840, 860, and 890 of the third chip 800. The hardwired switch 380 of the second chip 200 and the hardwired switches 850 and 880 of the third chip 800 do not have TSVs.

In the manners of disposing the TSVs, the voltage source V1 supplies the ground voltage VSS to the first circuit block 210 and the third circuit block 310 through a third bonding pad 630k of the third chip 800, the hardwired switch 840, the hardwired switch 340, the hardwired switch 240 in sequence. The voltage source V2 supplies the system voltage VDD to the seventh circuit block 810 through the fourth bonding pad 640k of the third chip 800 and the hardwired switch 840 in sequence. The voltage source V1' supplies the ground voltage VSS to the fourth circuit block 320 and the eighth circuit block 820 through a third bonding pad 630m of the third chip 800, the hardwired switch 860, and the hardwired switch 360 in sequence. The voltage source V2' supplies the system voltage VDD to the second circuit block 220 through a fourth bonding pad 640m of the third chip 800, the hardwired switch 860, the hardwired switch 360, the hardwired switch 260, and a second bonding pad 610e in sequence. The voltage source V1" supplies the ground voltage VSS to the fifth circuit block 270 and the ninth circuit block 870 through a third bonding pad 630o of the third chip 800, the hardwired switch 890, the hardwired switch 390, the hardwired switch 290, and a first bonding pad 610h in sequence. The voltage source V2" supplies the system voltage VDD to the sixth circuit block 370 through a fourth bonding pad 640o of the third chip 800, the hardwired switch 890, and the hardwired switch 390 in sequence.

In other words, the voltage source V2 does not supply the system voltage VDD to the third circuit block 310 of the second chip 300 and the first circuit block 210 of the first chip 200, that is, the first circuit block 210 and the third circuit block 310 are disabled. The voltage source V2' does not supply the system voltage VDD to the fourth circuit block 320 of the second chip 300 and the eighth circuit block 820 of the third chip 800, that is, the fourth circuit block 320 and the eighth circuit block 820 are disabled. The voltage source V2" does not supply the system voltage VDD to the fifth circuit block 270 of the first chip 200 and the ninth circuit block 870 of the third chip 800, that is, the fifth circuit block 270 and the ninth circuit block 870 are disabled.

The output signal of the seventh circuit block 810 is transmitted to the second signal terminal 222 of the second circuit block 220 of the first chip 200 through the hardwired switch 850, the hardwired switch 350, the hardwired switch 250, and the second bonding pad 620b in sequence. In other words, the seventh circuit block 810 of the third chip 300 is electrically connected to the second circuit block 220 through the hardwired switch 850, the hardwired switch 350, and the hardwired switch 250. Thus, the seventh circuit block 810 is able to replace the first circuit block 210 of the first chip 200 to provide the first function to the second circuit block 220. The output signal of the second circuit block 220 is transmitted to the signal terminal 370a of the sixth circuit block 370 of the second chip 300 through the first bonding pad 610g, the hardwired switch 280, and the hardwired switch 380 in sequence. Thus, the second circuit block 220 is able to replace the fourth circuit block 320 of the second chip 300 to provide the second function to the sixth circuit block 370. In brief, the stacked structure of chips 100b formed by stacking the stack first chip 200, the second chip 300, and the third chip 800 has functions of a complete circuit block (including the first function, the second function, and the third function).

In view of the above, in this embodiment, the method for repairing a chip includes replacing the first chip having a defective circuit block with a second chip having a functional circuit block with the same function, so as to form a stacked structure of chips having complete product functions. In other words, a plurality of defective chips may be incorporated into a functional product, so as to reduce the number of discarded chips (defective chips). In addition, the stacked structure of chips forms various modes for transmitting signals and power through TSVs disposed in various manners of the hardwired switches. Thus, a purpose of switching paths for transmitting signals and power may be achieved without changing the manners of disposing the conductive bump and the chip surface lines, and the signals and power may be prevented from being transmitted to the defective circuit blocks.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for repairing a chip, comprising:
   providing a first chip, wherein the first chip comprises a first circuit block with a first function, a second circuit block with a second function, and a signal path electrically connected to the first circuit block and the second circuit block, the first circuit block comprises a first power terminal and a first signal terminal, the second circuit block comprises a second signal terminal, and the signal path connects the first signal terminal and the second signal terminal;
   obtaining a first verification result by verifying a function of the first chip;
   providing a second chip, wherein the second chip comprises a third circuit block with the first function, and the third circuit block comprises a third power terminal and a third signal terminal;
   obtaining a second verification result by verifying a function of the second chip;
   disabling the first circuit block if the first verification result shows that the first circuit block of the first chip is defective;
   electrically connecting the third circuit block to the signal path to replace the first circuit block and provide the first function if the first verification result shows that the second circuit block of the first chip is functional and the second verification result shows that the third circuit block of the second chip is functional;
   stacking the first chip and the second chip; and
   disposing a first hardwired switch of the first chip and a third hardwired switch of the second chip correspondingly according to the first verification result and the second verification result, wherein the first hardwired switch is connected to the first power terminal, the third hardwired switch is connected to the third power terminal and electrically connected to the first hardwired switch, such that a power-supply bonding pad is connected to the third power terminal of the second chip and disconnected to the first power terminal of the first chip.

2. The method for repairing a chip according to claim 1, further comprising:
   disposing a second hardwired switch of the first chip and a fourth hardwired switch of the second chip correspondingly, wherein the second hardwired switch is connected to the signal path, the fourth hardwired switch is connected to the third signal terminal and electrically connected to the second hardwired switch, such that the third circuit block of the second chip is electrically connected to the signal path to replace the first circuit block of the first chip.

3. The method for repairing a chip according to claim 2, wherein the first hardwired switch and the second hardwired switch both comprise a first set of landing pads disposed on a first surface of the first chip and a second set of landing pads disposed on a second surface of the first chip, the third hardwired switch and the fourth hardwired switch both comprise a third set of landing pads disposed on a first surface of the second chip and a fourth set of landing pads disposed on a second surface of the second chip, and the manner of stacking the first chip and the second chip comprises:
   electrically connecting the second set of landing pads of the first hardwired switch and the third set of landing pads of the third hardwired switch; and
   electrically connecting the second set of landing pads of the second hardwired switch and the third set of landing pads of the corresponding fourth hardwired switch.

4. The method for repairing a chip according to claim 3, wherein the first set of landing pads comprises a first landing pad, a second landing pad, a third landing pad, and a fourth landing pad, the second set of landing pads comprises a fifth landing pad, a sixth landing pad, a seventh landing pad, and an eighth landing pad, the second landing pad is electrically connected to the first landing pad, the fourth landing pad is electrically connected to the third landing pad, the fifth landing pad is electrically connected to the eighth landing pad, the sixth landing pad is electrically connected to the seventh landing pad, the first landing pad and the fifth landing pad overlap partially or completely in a vertical direction of the first chip, the second landing pad and the sixth landing pad overlap partially or completely in the vertical direction of the first chip, the third landing pad and the seventh landing pad overlap partially or completely in the vertical direction of the first chip, and the fourth landing pad and the eighth landing pad overlap partially or completely in the vertical direction of the first chip.

5. The method for repairing a chip according to claim 4, further comprising:
   determining whether to selectively dispose a first through silicon via (TSV) between the first landing pad and the fifth landing pad, or between the second landing pad and the sixth landing pad, or between the third landing pad and the seventh landing pad, or between the fourth landing pad and the eighth landing pad or not according to the first verification result.

6. The method for repairing a chip according to claim 5, further comprising:
   determining whether to selectively dispose a second TSV between the first landing pad and the fifth landing pad, or between the second landing pad and the sixth landing pad, or between the third landing pad and the seventh landing pad, or between the fourth landing pad and the eighth landing pad or not according to the first verification result.

7. The method for repairing a chip according to claim 4, further comprising:
   disposing a first bonding pad on the first surface of the first chip, wherein the first bonding pad is electrically connected to the first landing pad;
   disposing a second bonding pad on the first surface of the first chip, wherein the second bonding pad electrically connected to the third landing pad;
   disposing a third bonding pad on the second surface of the first chip, wherein the third bonding pad is electrically connected to the fifth landing pad;

disposing a fourth bonding pad on the second surface of the first chip, wherein the fourth bonding pad is electrically connected to the seventh landing pad;

disposing a fifth bonding pad on the second chip at a position corresponding to the third bonding pad; and disposing a sixth bonding pad on the second chip at a position corresponding to the fourth bonding pad, wherein the fifth bonding pad is electrically connected to the third bonding pad and the sixth bonding pad is electrically connected to the fourth bonding pad when the first chip and the second chip are stacked.

8. The method for repairing a chip according to claim 7, further comprising:

disposing a first conductive bump between the third bonding pad and the fifth bonding pad; and disposing a second conductive bump between the fourth bonding pad and the sixth bonding pad, wherein the fifth bonding pad is electrically connected to the third bonding pad through the first conductive bump and the sixth bonding pad is electrically connected to the fourth bonding pad through the second conductive bump when the first chip and the second chip are stacked.

9. The method for repairing a chip according to claim 1, further comprising:

disposing an isolation circuit between the first signal terminal and the second signal terminal, for selectively isolating a signal of the first signal terminal from the signal path.

* * * * *